United States Patent
Rouse et al.

(10) Patent No.: US 7,969,171 B1
(45) Date of Patent: Jun. 28, 2011

(54) TEST CIRCUIT AND SYSTEM

(75) Inventors: Eric Wade Rouse, Mount Washington, KY (US); Paul Douglas Kelley, Louisville, KY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/683,064

(22) Filed: Jan. 6, 2010

(51) Int. Cl.
*G01R 31/26* (2006.01)
(52) U.S. Cl. .............. 324/754.01; 324/762.02
(58) Field of Classification Search .......... None
See application file for complete search history.

(56) References Cited

U.S. PATENT DOCUMENTS

| | | | |
|---|---|---|---|
| 4,646,299 A | 2/1987 | Schinabeck et al. | |
| 4,746,855 A | 5/1988 | Wrinn | |
| 4,760,330 A * | 7/1988 | Lias, Jr. ................ | 714/32 |
| 4,908,576 A | 3/1990 | Jackson | |
| 5,101,151 A | 3/1992 | Beaufils et al. | |
| 5,225,834 A | 7/1993 | Imai et al. | |
| 5,357,191 A | 10/1994 | Grace | |
| 5,406,197 A | 4/1995 | Mercier et al. | |
| 5,504,432 A | 4/1996 | Chandler et al. | |
| 5,570,027 A | 10/1996 | Stans et al. | |
| 6,054,863 A | 4/2000 | Morrison et al. | |
| 6,314,538 B1 * | 11/2001 | Ochoa et al. ............. | 714/724 |
| 6,453,435 B1 | 9/2002 | Limon, Jr. et al. | |
| 6,542,844 B1 | 4/2003 | Hanna | |
| 6,731,217 B1 | 5/2004 | Warner | |
| 6,937,006 B2 * | 8/2005 | West ................. | 324/750.01 |
| 7,110,905 B2 | 9/2006 | Le et al. | |
| 7,174,490 B2 * | 2/2007 | Evans ................. | 714/724 |
| 7,500,162 B2 * | 3/2009 | Smith ................. | 714/725 |
| 2009/0192753 A1 | 7/2009 | Salmon | |

* cited by examiner

*Primary Examiner* — Vinh P Nguyen
(74) *Attorney, Agent, or Firm* — Dority & Manning, P.A.

(57) ABSTRACT

A test circuit and system for testing one or more electrical properties of an electronic circuit or other device under test (DUT) by applying and monitoring test signals to the DUT is disclosed. The test circuit can utilize a plurality of universal interface channel circuits in a single automated test system to provide a unique and flexible approach for testing electronic circuits or devices that has many advantages. A single data acquisition circuit can be coupled to one or more universal interface channel circuits. Each of the universal interface channel circuits can be independently commanded by the data acquisition circuit to provide one of a variety of test signals to a DUT as desired.

19 Claims, 2 Drawing Sheets

TEST CIRCUIT AND SYSTEM

FIELD OF THE INVENTION

The present invention relates generally to automated testing systems for testing electronic circuits and devices and, more particularly, to a test circuit and system configured to provide a variety of different test signals to a device.

BACKGROUND OF THE INVENTION

Automated testing systems are used to test one or more electrical properties of electronic circuit(s) and device(s) by applying and monitoring test signals to the electronic circuit (s) or device(s) (hereinafter collectively referred to as a device under test (DUT)). In typical automated testing systems, one or more electrical test signals are provided to various nodes of the DUT and various outputs of the DUT are monitored. The test signals are typically applied from channel interface circuits that couple the test system to the DUT.

Conventional automated test systems typically contain a plurality of expensive data acquisition circuits to cover and test the wide variety of electronic circuits available. These data acquisition circuits can include a multi-channel analog output card(s), multi-channel analog input card(s), multi-channel digital output card(s), multi-channel digital input card(s), an oscilloscope card(s), a digital multimeter (DMM) card(s), a waveform generator card(s), a counter/timer card(s) and/or other suitable data acquisition circuits. In addition, many of the more sophisticated systems typically contain relay multiplexer/scanner cards that allow from four to sixteen programmable channel interface connections to be made at one time. Such testing systems require an increased number of components and cables, leading to increased size, cost and complexity of the test circuit design.

Thus, there is a need for a test circuit that provides the functional capability to test a wide variety of electronic circuits and devices and that includes the capability to provide any desired test signal on command without wiring changes that overcomes the above mentioned disadvantages.

BRIEF DESCRIPTION OF THE INVENTION

Aspects and advantages of the invention will be set forth in part in the following description, or may be obvious from the description, or may be learned through practice of the invention.

One exemplary embodiment of the present disclosure is directed to a universal interface channel circuit. The universal interface channel circuit includes a first path configured to accommodate a first test signal and a second path configured to accommodate a second test signal. The universal interface channel circuit further includes a test node and a switching device. The universal interface channel circuit is coupled to a first I/O device configured to provide the first test signal and a second I/O device configured to provide the second test signal. The first I/O device controls the switching device of the universal interface channel circuit to selectively couple one of the first path or the second path to the test node.

Another exemplary embodiment of the present disclosure is directed to a system. The system includes a data acquisition circuit configured to provide a first test signal and a channel circuit board coupled to the data acquisition circuit. The channel circuit board includes a plurality of channel circuits and an I/O device. The I/O device is configured to provide a second test signal to each of the plurality of channel circuits. Each channel circuit includes a first path configured to accommodate the first test signal, a second path configured to accommodate the second test signal, a test node, and a switching device configured to selectively coupled one of the first path or the second path to the test node. The I/O device is configured to independently control the switching device of each channel circuit.

Variations and modifications can be made to these exemplary embodiments of the present disclosure.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWING

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Figure 1:
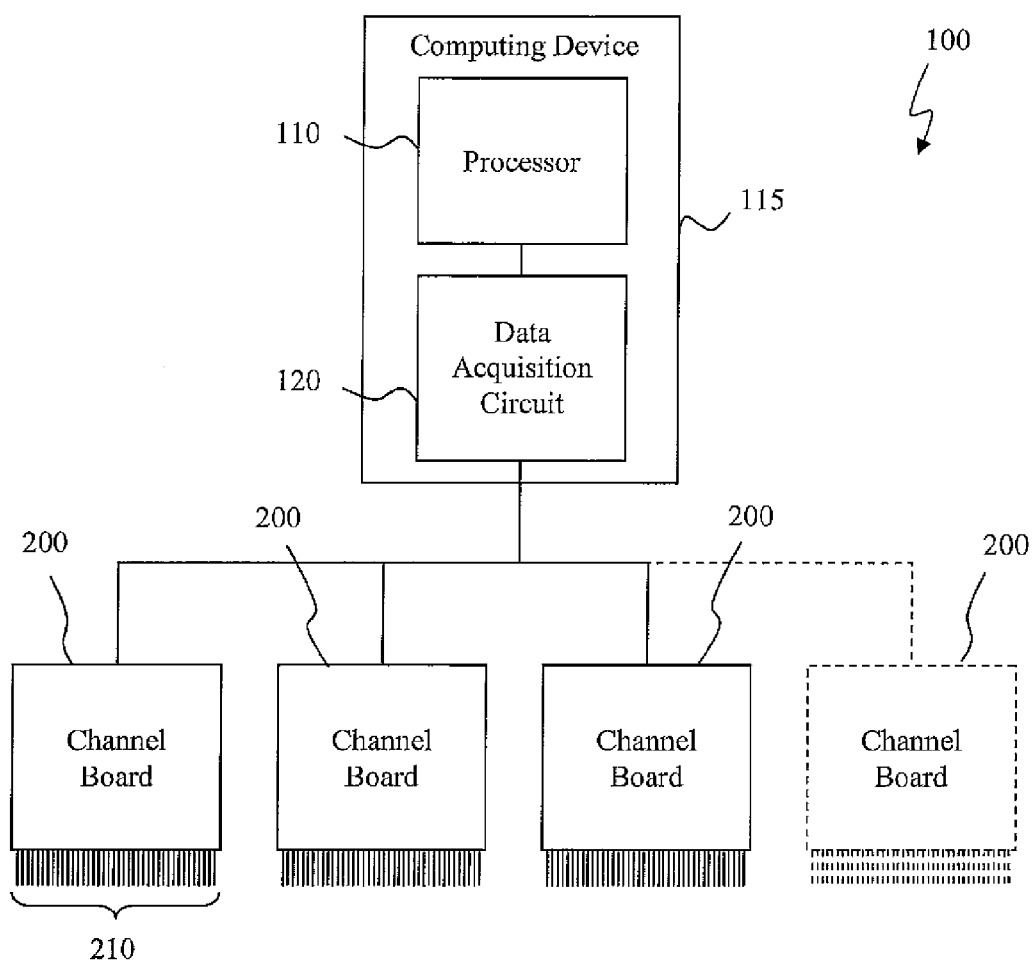
FIG. 1 provides a block diagram of an exemplary test system according to one exemplary embodiment of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention covers such modifications and variations as come within the scope of the appended claims and their equivalents.

In general, the present disclosure is directed to a test circuit for testing one or more electrical properties of an electronic circuit or other device under test (DUT) by applying and monitoring test signals to the DUT. As used herein the term "test signal" is intended to refer to any signal provided to or received from the DUT for the purpose of testing or monitoring electrical or other properties of the DUT, including, for instance, digital input signals, digital output signals, analog input signals, analog output signals, static analog signals, signals provided to or received from a DUT that are used to perform any measurements of electrical or other properties of a DUT, or other suitable test signals. As used herein, use of the term "providing a test signal" is intended to encompass both providing and/or receiving a test signal.

In accordance with an exemplary embodiment of the present disclosure, a test circuit is disclosed that provides a unique and flexible approach for testing electronic circuits or devices. The test circuit can include a single data acquisition circuit or other I/O device that is coupled to one or more universal interface channel circuit boards. Each of the universal interface channel circuit boards includes a plurality of relatively inexpensive universal interface channel circuits.

For instance, each universal interface channel circuit board may include 64 individual universal interface channel circuits.

Each of the universal interface channel circuits can be independently commanded by the data acquisition circuit or other I/O device to provide one of a variety of different test signals to a DUT. For instance, the universal interface channel circuits can be commanded to provide a digital input signal, a digital output signal, an analog input signal, an analog output signal, an oscilloscope signal, a DMM signal, a counter/timer signal, a comparator signal, a static analog signal, or other suitable test signal as desired. In this manner, a single data acquisition circuit can be interfaced with up to hundreds of relatively inexpensive universal interface channel circuits that have the capability to provide any desired test signal on command without wiring changes.

The test circuit design according to embodiments of the present technology provides numerous advantages. For instance, the test system can be three to five times less expensive and half the size of a conventional test system. Moreover, only one data acquisition circuit or board is needed as opposed to eight or more in a conventional automated test system and the need for separate mux/scanner boards is completely eliminated. This results in a reduced and simplified test circuit design that requires fewer cables between components of the test system. In addition, the use of universal interface channel circuits eliminates the need for custom interface circuitry in the test system.

FIG. 1 depicts a block diagram of a test system 100 according to one exemplary embodiment of the present disclosure. Test system 100 includes a computing device 115 having a processor 110, and a data acquisition circuit 120. The computing device 115 is interfaced with a plurality of universal interface channel circuit boards 200. One of the universal interface channel boards 200 is illustrated in dashed line to signify that any number of universal interface channel boards 200 can be interfaced with the computing device 115, processor 110, and/or data acquisition circuit 120 without deviating from the scope of the present disclosure. Each of the universal interface channel boards 200 includes a plurality of universal interface channel circuits 210 that can be independently commanded by the data acquisition circuit 120 to provide one of a variety of test signals to a DUT.

Processor 110 is the main processing unit of system 100. Processor 110 can be a part of data acquisition circuit 120 or separate from data acquisition circuit 120. As will be discussed in detail below, processor 110 can be programmed to control the various test and control signals provided by data acquisition circuit 120 to the universal interface channel boards 200. For instance, processor 110 can be programmed to command data acquisition circuit 120 to act as an oscilloscope, digital multimeter (DMM), comparator, signal generator, timer/counter, or other test device.

Using the disclosures provided herein, one of ordinary skill in the art will recognize that the inherent flexibility of computer-based systems allows for a great variety of possible configurations, combinations, and divisions of tasks and functionality between and among components. The various computing devices discussed herein are not limited to any particular hardware architecture or configuration. Embodiments of the methods and systems set forth herein may be implemented by one or more general-purpose or customized computing devices adapted in any suitable manner to provide desired functionality. The device(s) may be adapted to provide additional functionality complementary or unrelated to the present subject matter, as well.

In addition, one or more computing devices may be adapted to provide desired functionality by accessing software instructions rendered in a computer-readable form. When software is used, any suitable programming, scripting, or other type of language or combinations of languages may be used to implement the teachings contained herein. However, software need not be used exclusively, or at all. For example, some embodiments of the methods and systems set forth herein may also be implemented by hard-wired logic or other circuitry, including, but not limited to application-specific circuits. Of course, combinations of computer-executed software and hard-wired logic or other circuitry may be suitable, as well.

Figure 2:
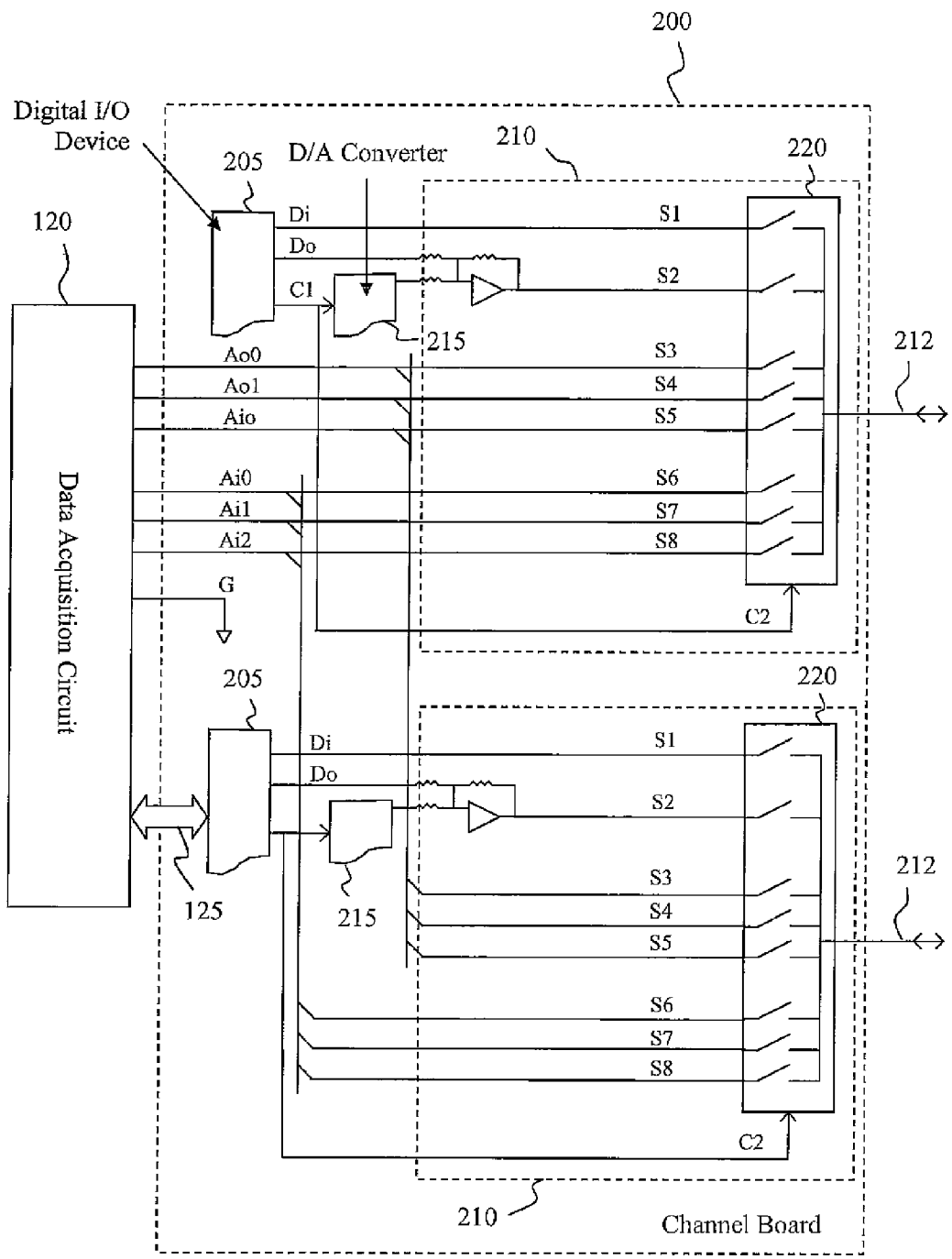
FIG. 2 provides a circuit diagram of a portion of an exemplary test system according to an exemplary embodiment of the present disclosure.

FIG. 2 illustrates a circuit diagram of a test circuit according to one exemplary embodiment of the present disclosure. FIG. 2 illustrates two universal interface channel circuits 210 disposed on a universal interface channel board 200. Those of ordinary skill in the art, using the disclosures provided herein, should readily appreciate that any number of universal interface channel circuits 210 can be included on universal interface channel board 200. For instance, in a particular embodiment, universal interface channel board 200 can include 64 universal interface channel circuits 210.

Each universal interface channel circuit 210 includes a test node 212 and a switching device 220. The switching device 220 is configured to selectively couple one of a plurality of paths S1, S2, S3, S4, S5, S6, S7, and S8 to test node 212. Although eight paths are provided to each universal interface channel circuit 210 of FIG. 2, those of ordinary skill in the art, using the disclosures provided herein, should understand that any number of paths S1, S2, . . . . Sn can be provided to each universal interface channel circuit 210 without deviating from the scope of the present disclosure.

Each of paths S1, S2, S3, S4, S5, S6, S7, and S8 is configured to accommodate a different test signal. The switching device 220 is controlled by digital I/O device 205 to selectively couple one of paths S1, S2, S3, S4, S5, S6, S7, and S8, and thereby selectively couple one of a variety of different test signals, to test node 212. In this manner, the system 100 according to embodiments of the present disclosure can provide any desired test signal on command through one of the plurality of universal interface channel circuits 210 without wiring changes.

The switching device 220 can be any device that can be controlled to selectively couple one of a plurality of inputs to test node 212. For instance, in a particular embodiment, switching device 220 is a multiplexer. Although an 8:1 multiplexer is illustrated in FIG. 2, those of ordinary skill in the art, using the disclosures provided herein, would understand that any size multiplexer can be used in accordance with the present disclosure to accompany any number of paths S1, S2, . . . Sn provided to the universal interface channel circuit 210.

Each universal interface channel circuit 210 is coupled to a digital I/O device 205, a digital to analog converter circuit 215, and to data acquisition circuit 120. Digital I/O device 205 can be any device capable of generating digital input and digital output signals. For instance, in a particular embodiment, digital I/O device 205 can be a field programmable gate array (FPGA) chip that receives instructions from the data acquisition circuit 120 via control bus 125. Each universal channel circuit board 200 can include its own digital I/O device 205.

Digital to analog converter circuit 215 is used to provide a static analog signal to each universal interface channel circuit 210 in response to control signals C1 received from digital I/O device 205. The static analog signal provided by digital to analog converter circuit 215 can be modified using an amplifier circuit to provide a static analog voltage source for each universal interface channel circuit 210. For instance, in a particular embodiment, digital to analog converter circuit 215 can be configured to provide a ±15V static analog voltage source signal to a universal interface channel circuit 210.

Data acquisition circuit 120 is an I/O device that can be used to provide a plurality of input and output test signals to the plurality of universal interface channel circuits 210. Data acquisition circuit 120 includes a plurality of electrical contacts Ao0, Ao1, Ao2 that operate as test signal outputs for data acquisition circuit 120. Although three signal outputs are illustrated in FIG. 2, those ordinary skill in the art, using the disclosures provided herein, should understand that data acquisition circuit 120 can include any number of test signal outputs without deviating from the scope of the present disclosure. Processor 110 controls the outputs provided to electrical contacts Ao0, Ao1, and Ao2 pursuant to instructions provided to computing device 115 by a user or other operator of the system.

Data acquisition circuit 120 also includes a plurality of electrical contacts Ai0, Ai1, Ai2 that operate as signal inputs. Although three signal inputs are illustrated in FIG. 2, those of ordinary skill in the art, using the disclosures provided herein, should understand that data acquisition circuit 120 can include any number of signal inputs without deviating from the scope of the present invention. Signal inputs Ai0, Ai1, Ai2 can be used to input test signals provided from a DUT through one or more universal channel interface circuits 210. Data acquisition circuit 120 can command signal inputs Ai0, Ai1, Ai2 to act as an oscilloscope, DMM, frequency meter, comparator, counter/timer, or other suitable test device pursuant to instructions provided to computing device 115 by a user or other operator of the system.

The interface between each universal interface channel circuit 210 and digital I/O device, digital to analog converter circuit 215, and data acquisition circuit 120 will now be discussed in detail. Digital I/O device 205 includes digital signal input Di and a digital signal output Do. Digital signal input Di is coupled to path S1 for each universal interface channel circuit 210. Digital signal output Do is coupled to path S2 for each universal interface channel circuit 210. Digital I/O device 205 can be configured to provide a separate digital input Di and a separate digital output Do to each universal interface channel circuit 210. In this manner, digital I/O device 205 can provide independent test signals to each of the plurality of universal interface channel circuits 210.

Digital to analog converter circuit 215 is coupled to path S2 of each universal interface channel circuit 210. Digital I/O device 205 is also configured to control the output of digital to analog converter circuit 215. For instance, digital I/O device 205 can provide control signals C1 to digital to analog converter circuit 215. This control signal C1 can be used to control whether path S2 is used to accommodate a static analog signal or a digital output signal.

Paths S3, S4, S5 are coupled to signal outputs Ao0, Ao1, and Ao2 from data acquisition circuit 120. Paths S6, S7, S8 are coupled to signal inputs Ai0, Ai1, and Ai2 from data acquisition circuit 120. As illustrated, the signal outputs Ao0, Ao1, and Ao2 are system wide signal outputs. Similarly, signal inputs Ai0, Ai1, and Ai2 are system side signal inputs. In other words, paths S3, S4, S5 for each universal interface channel circuit 210 are coupled to the same signal outputs Ao0, Ao1, and Ao2 of data acquisition circuit 120. Paths S6, 57, and S8 are coupled to the same signal inputs Ai0, Ai1, and Ao2 of data acquisition circuit. In this manner, a single data acquisition circuit 120 is directly interfaced with each of the plurality of universal interface channel circuits 210 providing a smaller, cheaper, and less complex test circuit design.

Path S1 of universal interface channel circuit 210 is coupled to a digital input Di of digital I/O device 205. Path S1 provides the capability for the universal interface channel circuit 210 to operate as a digital input. In particular, path S1 accommodates a digital high or a digital low read from the test node 212. The digital input can be read from test node 212 independent of any other universal interface channel circuit 210.

Path S2 of universal interface channel circuit 210 is coupled to a digital output Do of digital I/O device 205. Path S2 provides the capability for the universal interface channel circuit 210 to operate as a digital output. Path S2 allows a digital high or digital low to be sourced to the test node 212 independent of any of other universal interface channel circuit 210. Path S2 can also provide the capability to provide a high speed digital pulse train to the test node 212 independent of any other universal interface channel circuit 210.

Path S2 also provides the capability for the universal interface channel circuit 210 to operate as a static analog voltage source. Path S2 is coupled to an output of digital to analog converter circuit 215. Digital to analog converter circuit 215 can be used to provide a static analog signal to each universal interface channel circuit 210 in response to control signals C1 received from digital I/O device 205. The static analog signal provided by digital to analog converter circuit 215 can be modified using an amplifier circuit to provide a static analog voltage source signal for universal interface channel circuit 210. For instance, in a particular embodiment, digital to analog converter circuit can be configured to provide a ±15V static analog voltage source signal to a universal interface channel circuit 210.

Paths S3, S4, and 55 are used to provide analog test signal waveforms to the test node 212 and provide the capability for universal interface channel circuit 210 to operate as a waveform generator. For example, in one exemplary embodiment, data acquisition circuit 120 can be controlled to provide a triangle wave output or other suitable analog signal to Ao0 and path S3, to provide a square wave output or other suitable analog signal to Ao1 and path S4, and to provide a sinusoidal wave output or other suitable analog signal to signal output Ao3 and path 55. Switching device 220 can be controlled to selectively couple one of paths S3, S4, or S5 to test node 212. In this manner, each universal interface channel circuit 210 can be independently commanded to act as one of a triangle wave generator, a square wave generator, a sinusoidal wave generator, or other suitable analog signal generator.

For example, in another embodiment, data acquisition circuit 120 can be controlled to provide one leg of a three-phase waveform to each of signal outputs Ao0, Ao1, and Ao2 and correspondingly to paths S3, S4, and S5. A first universal interface channel circuit 210 can be commanded to couple path S3 to test node 212 so that the first universal interface channel circuit 210 acts as a first leg of the three phase wave form. A second universal interface channel circuit 210 can be commanded to couple path S4 to test node 212 so that the second universal interface channel circuit 210 acts as a second leg of the three phase wave form. A third universal interface channel circuit 210 can be commanded to couple path S5 to test node 212 so that the third universal interface channel circuit 210 acts as a third leg of the three phase waveform.

Paths S6, S7, and S8 can be used to accommodate analog test signal waveforms and provide the capability for universal interface channel circuit 210 to operate as a DMM, an oscilloscope, a counter/timer, comparator, or other suitable test device. For instance, data acquisition circuit 120 can be controlled to provide a DMM signal to Ai0 and path S6, to provide a counter/timer signal to Ai1 and path S7, and to provide an oscilloscope signal to Ai2 and path S8. Switching device 220 can be controlled to selectively coupled one of paths S6, S7, or S8 to test node 212. In this manner, each universal interface channel circuit 210 can be independently commanded to act as one of a DMM, counter/timer, oscilloscope, or other suitable test device.

In a particular embodiment, any of paths S6, S7, and S8 can be used to perform single ended DMM or oscilloscope measurements with reference to a ground or reference signal G. In this embodiment, data acquisition circuit 120 can be controlled to provide a DMM signal or an oscilloscope signal to one of Ai0, Ai1, or Ai2 and correspondingly to S6, S7, or S8. Switching device 220 of universal interface channel circuit 210 can be controlled to selectively couple the DMM signal or oscilloscope signal to the test node 212. The test node 212 can be used to make a single ended-measurement with reference to a ground or reference signal G provided at the data acquisition circuit 120.

In another embodiment, paths S6, S7, and S8 can be used to perform differential DMM or oscilloscope measurements. For example, data acquisition circuit 120 can be controlled to provide a positive side of a differential DMM or oscilloscope measurement signal to Ai1 and path S7. Data acquisition circuit 120 could also be controlled to provide a negative side of a differential DMM or oscilloscope measurement signal to Ai2 and path S8. A first universal interface channel circuit 210 can be commanded to selectively couple path S7 to test node 212 and a second universal interface channel circuit 210 can be commanded to selectively couple path S8 to test node 212. In this manner, the first and second universal interface channel circuits 210 can be used to perform differential DMM or oscilloscope measurements.

Digital I/O device 205 controls the switching device of each of the universal interface channel circuit 210. Digital I/O device 205 is configured to send control signals C2 to switching device 220 to control which of paths S1, S2, S3, S4, S5, S6, S7 and S8 is coupled to test node 212. In this manner, the digital I/O device 205, in response to instructions or commands received from data acquisition circuit 120 and/or processor 110, can independently command each of the universal interface channel circuits 210 to provide one of a variety of test signals through test node 212 to a DUT.

Data acquisition circuit 120 controls the digital I/O device 205 of each universal channel circuit board 200. Digital I/O device 205 is coupled to data acquisition circuit 120 through control bus 125. Control bus 125 is used to communicate control signals and other information or data between data acquisition circuit 120 and control bus 125. In a particular embodiment, the control bus 125 can be a 12 bit master control bus provided through a USB cable interface. In other embodiments, control bus 125 can be implemented using a PCI, PXI, or other suitable interface.

The test and control signals provided by data acquisition circuit 120 are controlled by processor 110. Processor 110 can be in communication with a user interface (not illustrated). A user or other operator can provide instructions to processor 110 and/or data acquisition circuit 120 through user interface. In this manner, a user or other operator can independently command each of the universal interface channel circuits 210 to provide one of a variety of different test signals to a DUT.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A test circuit, comprising:
    a data acquisition circuit configured to provide a first test signal;
    a digital I/O device configured to provide a control signal and a second test signal; and
    at least one channel circuit said channel circuit comprising
        a first path configured to accommodate the first test signal;
        a second path configured to accommodate the second test signal;
        a test node; and
        a switching device;
    wherein said digital I/O device is coupled to the switching device such that said digital I/O device provides the control signal to said switching device to control said switching device to selectively couple one of said first path or said second path to said test node.

2. The test circuit of claim 1, wherein said first test signal comprises one of a digital input signal, a digital output signal, a static analog signal, an analog input signal, an analog output signal, an oscilloscope signal, a digital multimeter signal, a counter/timer signal, or a comparator signal.

3. The test circuit of claim 2, wherein the second test signal comprises one of a digital input signal, a digital output signal, a static analog signal, an analog input signal, an analog output signal, an oscilloscope signal, a digital multimeter signal, a counter/timer signal, or a comparator signal.

4. The test circuit of claim 1, wherein said data acquisition circuit is configured to control said digital I/O device.

5. The test circuit of claim 1, wherein said at least one channel circuit is located on a channel circuit board, said channel circuit board comprising a plurality of channel circuits.

6. The test circuit of claim 5, wherein said digital I/O device is configured to provide a different first test signal to each of said plurality of test circuits.

7. The test circuit of claim 6, wherein said data acquisition circuit is configured to provide the same second test signal to each of said plurality of test circuits.

8. A system, comprising:
    a data acquisition circuit configured to provide a first test signal;
    a channel circuit board coupled to said data acquisition circuit, said channel circuit board comprising a plurality of channel circuits and a plurality of I/O devices, wherein each of said plurality of I/O devices are configured to provide a second test signal to at least one of said plurality of channel circuits;
    each said channel circuit comprising a first path configured to accommodate the first test signal, a second path configured to accommodate the second test signal, a test node, and a switching device configured to selectively couple one of said first path or said second path to said test node;
    wherein each of said plurality of I/O devices is configured to control said switching device of at least one of said plurality of channel circuits.

9. The system of claim 8, wherein said data acquisition circuit is configured to provide the same first test signal to each of said plurality of channel circuits.

10. The system of claim 8, wherein said data acquisition circuit is configured to control each of said plurality of I/O devices.

11. The system of claim 8, wherein said data acquisition circuit is coupled to a plurality of channel circuit boards.

12. A test circuit, comprising:
- a data acquisition circuit configured to provide a plurality of analog output signals through a plurality of first electrical contacts and to provide a plurality of analog input signals through a plurality of second electrical contacts;
- a digital I/O device configured to provide a digital output signal and a digital input signal;
- a digital to analog converter circuit configured to provide a static analog signal;
- a plurality of channel circuits, each said channel circuit comprising a plurality of first paths coupled to said plurality of first electrical contacts, a plurality of second paths coupled to said plurality of second electrical contacts, a third path configured to accommodate the digital input signal, a fourth path configured to accommodate the digital output signal and the static analog signal, a switching device, and a test node;
- wherein said switching device of each said channel circuit is configured to selectively couple one of said plurality of first paths, plurality of second paths, third path, or fourth path to said test node.

13. The test circuit of claim 12, wherein said switching device comprises a multiplexer.

14. The test circuit of claim 12, wherein said digital I/O device is configured to independently control said switching device of each said channel circuit.

15. The test circuit of claim 12, wherein said data acquisition circuit comprises a processor configured to control the plurality of analog output signals and the plurality of analog input signals provided by said data acquisition circuit.

16. The test circuit of claim 12, wherein said data acquisition circuit is configured to control the digital I/O device.

17. The test circuit of claim 12, wherein at least one of said plurality of channel circuits is used to perform a single ended digital multimeter or oscilloscope measurement.

18. The test circuit of claim 12, wherein said plurality of channel circuits comprises a first channel circuit and a second channel circuit, said first channel circuit being configured to operate as a positive path for a differential digital multimeter or oscilloscope measurement and said second channel circuit being configured to operate as a negative path for a differential digital multimeter or oscilloscope measurement.

19. The test circuit of claim 12, wherein said plurality of channel circuits comprises a first channel circuit, a second channel circuit and a third channel circuit, said first channel circuit configured to accommodate a first leg of a three phase waveform, the second channel circuit configured to accommodate a second leg of the three phase waveform, and the third channel configured to accommodate a third leg of the three phase waveform.

* * * * *